(12) United States Patent
Knisley et al.

(10) Patent No.: US 9,153,482 B2
(45) Date of Patent: Oct. 6, 2015

(54) METHODS AND APPARATUS FOR SELECTIVE DEPOSITION OF COBALT IN SEMICONDUCTOR PROCESSING

(71) Applicant: Lam Research Corporation, Fremont, CA (US)

(72) Inventors: Thomas Joseph Knisley, Beaverton, OR (US); Nagraj Shankar, Tualatin, OR (US); Pramod Subramonium, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/171,483

(22) Filed: Feb. 3, 2014

(65) Prior Publication Data

US 2015/0221542 A1    Aug. 6, 2015

(51) Int. Cl.

| | |
|---|---|
| H01L 21/44 | (2006.01) |
| H01L 21/302 | (2006.01) |
| H01L 21/461 | (2006.01) |
| H01L 21/768 | (2006.01) |
| H01L 23/532 | (2006.01) |
| H01L 21/268 | (2006.01) |
| C23C 16/18 | (2006.01) |
| C23C 16/04 | (2006.01) |

(52) U.S. Cl.
CPC ............ *H01L 21/7685* (2013.01); *C23C 16/04* (2013.01); *C23C 16/18* (2013.01); *H01L 21/2686* (2013.01); *H01L 21/76879* (2013.01); *H01L 23/53238* (2013.01)

(58) Field of Classification Search
USPC .......... 438/598, 652, 653, 643, 689; 257/E21.476, E21.575, E21.579, 257/E21.584, E21.627, E21.641
See application file for complete search history.

(56) References Cited

U.S. PATENT DOCUMENTS

| | | | | |
|---|---|---|---|---|
| 7,858,510 | B1* | 12/2010 | Banerji et al. | 438/598 |
| 8,586,473 | B1* | 11/2013 | Tanwar et al. | 438/652 |
| 2009/0269507 | A1* | 10/2009 | Yu et al. | 427/535 |
| 2011/0111533 | A1 | 5/2011 | Varadarajan et al. | |

(Continued)

OTHER PUBLICATIONS

Kakuhara, et. al., (2010) "Comparison of Lifetime Improvements in Electromigration between Ti Barrier Metal and Chemical Vapor Deposition Co Capping," *Japanese Journal of Applied Physics*, 49:04DB08, 1-5 pages.

(Continued)

*Primary Examiner* — Mohsen Ahmadi
(74) *Attorney, Agent, or Firm* — Weaver Austin Villeneuve & Sampson LLP

(57) ABSTRACT

Methods and apparatus for selective deposition of cobalt on copper lines in the presence of exposed dielectric in semiconductor processing are provided. Cobalt in its metallic form is selectively deposited onto copper in the presence of dielectric by contacting a prepared surface of the substrate with an organometallic cobalt compound in a presence of a reducing agent. Surface preparation involves $H_2$ treatment with concurrent UV light irradiation. After the substrate surface is prepared, the substrate is contacted with an organometallic cobalt compound comprising a substituted or unsubstituted allyl ligand in a presence of a reducing agent to selectively deposit cobalt on copper. No plasma treatment during or after cobalt deposition is necessary, and the method can be used in a presence of a ULK dielectric without causing damage to dielectric. Deposited cobalt caps are used to reduce copper electromigration and to improve adhesion of copper to subsequently deposited layers.

18 Claims, 10 Drawing Sheets

(56) References Cited

U.S. PATENT DOCUMENTS

| | | |
|---|---|---|
| 2012/0177845 A1 | 7/2012 | Odedra et al. |
| 2013/0260555 A1 | 10/2013 | Zope et al. |
| 2014/0106083 A1 | 4/2014 | Wu et al. |

OTHER PUBLICATIONS

Nogami et al., (2010) "CVD Co and its Application to Cu Damascene Interconnections," *Proceedings of the IITC, IEEE*, 3 pages.

Simon et al., (2013) "Electromigration Comparison of Selective CVD Cobalt Capping with PVD Ta(N) and CVD Cobalt Liners on 22nm-Groundrule Dual-Damascene Cu Interconnects," *Reliability Physics Symposium (IRPS), IEEE International*, p. 3F.4.1-3F.4.6; 6 pages.

Yang, et al., (Jul. 2010) "Characterization of Selectively Deposited Cobalt Capping Layers: Selectivity and Electromigration Resistance", *IEEE Electron Device Letters*, 31(7):728-730.

Yang et al., (2011) "CVD Co Capping Layers for Cu/Low-k Interconnects: Cu EM enhancement vs. Co thickness," *International Interconnect Technology Conference (IITC), IEEE International*, 3 pages.

U.S. Appl. No. 14/465,610, filed Aug. 21, 2014, entitled "Method for Void-Free Cobalt Gap Fill."

\* cited by examiner

METHODS AND APPARATUS FOR SELECTIVE DEPOSITION OF COBALT IN SEMICONDUCTOR PROCESSING

FIELD OF THE INVENTION

The present invention pertains to methods of forming layers of material on a partially fabricated integrated circuit. Specifically, the invention pertains to methods for selectively forming cobalt layers on copper lines in a presence of a dielectric, for improving copper interconnect performance.

BACKGROUND

Damascene processing is a method for forming metal lines on integrated circuits. It involves formation of inlaid metal lines in trenches and vias formed in a dielectric layer (inter layer dielectric). Damascene processing is often a preferred method because it requires fewer processing steps than other methods and offers a higher yield. It is also particularly well-suited to metals such as copper that cannot be readily patterned by plasma etching.

In a typical Damascene process flow, metal is deposited onto a patterned dielectric to fill the vias and trenches formed in the dielectric layer. The resulting metallization layer is typically formed either directly on a layer carrying active devices, or on a lower-lying metallization layer. A thin layer of a dielectric diffusion barrier material, such as silicon carbide or silicon nitride, is deposited between adjacent metallization layers to prevent diffusion of metal into bulk layers of dielectric. In some cases, the silicon carbide or silicon nitride dielectric diffusion barrier layer also serves as an etch stop layer during patterning of inter layer dielectric (ILD).

In a typical integrated circuit (IC), several metallization layers are deposited on top of each other forming a stack, where metal-filled vias and trenches serve as IC conducting paths. The conducting paths of one metallization layer are connected to the conducting paths of an underlying or overlying layer by a series of Damascene interconnects.

Fabrication of these interconnects presents several challenges, which become more and more significant as the dimensions of IC device features continue to shrink. There is a strong need for interconnect fabrication methods that can provide interconnects with improved lifetime and reliability.

SUMMARY

Methods and apparatus for selectively depositing cobalt on or within copper lines of an IC substrate in a presence of exposed dielectric are provided. Advantageously, the methods can be performed without the use of plasma and without causing plasma-induced damage to dielectric. The selectively deposited cobalt caps can improve reliability of formed copper interconnects, reduce copper electromigration, and improve adhesion of copper to subsequently-deposited dielectric layers.

In one aspect, a method for forming a semiconductor device structure is provided, wherein the method comprises: (a) providing a semiconductor substrate (e.g., a partially fabricated Damascene structure) having a surface comprising an exposed layer of copper or copper alloy and an exposed layer of dielectric; (b) treating the substrate surface with a process gas comprising $H_2$, while irradiating the substrate with ultraviolet (UV) radiation in an absence of plasma; and (c) selectively depositing cobalt metal on or within the layer of copper or copper alloy, while not depositing cobalt on the layer of dielectric by contacting the treated substrate with an organometallic cobalt compound comprising a substituted or unsubstituted allyl ligand, and with a reducing agent, in an absence of plasma.

In some embodiments, the organometallic cobalt compound is:

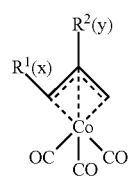

I where $R^1$ is $C_1$-$C_8$-alkyl, $R^2$ is $C_1$-$C_8$ alkyl, x is zero, 1 or 2; and y is zero or 1.

In some embodiments $R^1$ is $C_2$-$C_8$-alkyl, and $R^2$ is independently $C_2$-$C_8$ alkyl.

In some embodiments, the organometallic cobalt compound is:

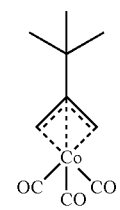

II

After the cobalt caps have been deposited, a dielectric diffusion barrier layer or an etch stop layer, is deposited onto the substrate. Advantageously, in some embodiments, the deposited cobalt is not treated with plasma prior to deposition of the dielectric diffusion barrier layer or an etch stop layer, and thereby damage to dielectric can be avoided.

In some embodiments, the substrate, prior to cobalt deposition, further includes exposed layer of tantalum or tantalum compound (e.g., tantalum nitride), which is used as a diffusion barrier layer between the copper line and the ILD layer. In some embodiments the cobalt metal is selectively deposited on or within the copper or copper alloy and is not substantially deposited on the layer of tantalum or tantalum compound.

In some embodiments UV treatment of the substrate's surface is performed in a first station of a module, and cobalt deposition is performed in a second station of a module, such that the semiconductor device structure is transferred from the first station to the second station without a vacuum break.

The UV treatment of the substrate's surface is performed, preferably, at a temperature of between about 300-400° C. (such as at a temperature of about 350° C.). The substrate can be irradiated with the light having a wavelength of between about 190-450 nm while being contacted with a gas comprising $H_2$. The treatment is capable of reducing copper oxide to copper on the layer of copper or copper alloy and to provide hydrophobicity to the dielectric layer.

The deposition of cobalt can be conducted in a chemical vapor deposition (CVD) mode, or in an atomic layer deposition (ALD) mode. In the CVD mode the organometallic compound and the reducing agent are concurrently delivered to the substrate. In an ALD mode, the organometallic compound and the reducing agent are sequentially delivered to the substrate. For example, an organometallic compound may be delivered and adsorbed on the substrate's surface followed by purging or evacuation of the process chamber to remove the compound. Next, the reducing agent is introduced and is allowed to react with the organometallic compound on the surface of the substrate, followed by a purge or evacuation of the process chamber. The dosing of reagents can be repeated as many times as necessary for building a cobalt layer of required thickness. In some embodiments between about 1-300 Å of cobalt metal is deposited onto the layer of copper or copper alloy in any of the deposition modes described above.

In some embodiments the reducing agent used in cobalt deposition comprises $H_2$. The deposition process can be performed at a temperature of between about 60-200° C., such as at a temperature of between about 70-100° C. The pressure in the deposition chamber is preferably between about 0.2-200 Torr. In one example, the pressure is about 1 Torr.

In a specific embodiment, cobalt is selectively deposited at a pressure of between about 0.2-200 Torr, at a temperature of between about 60-200 degrees C. (more preferably at about 80 degrees C.) using compound II as the organometallic cobalt compound, and with $H_2$ being used as a reducing agent.

In some embodiments cobalt is deposited selectively in the presence of exposed ultra low-k (ULK) dielectric having a dielectric constant of less than about 2.8.

In some embodiments the methods provided herein are integrated with lithographic patterning methods and further include the steps of: applying photoresist to the substrate; exposing the photoresist to light; patterning the resist and transferring the pattern to the workpiece; and selectively removing the photoresist from the work piece.

In another aspect, an apparatus for semiconductor device processing is provided. The apparatus includes one or more process chambers configured for semiconductor device processing and has a controller comprising program instructions for performing any of the methods provided herein. For example, the controller can include instructions for: (a) pre-treating a semiconductor substrate having an exposed layer of copper or copper alloy and an exposed layer of dielectric by contacting the substrate surface with a process gas comprising $H_2$, while irradiating the substrate with ultraviolet (UV) radiation in an absence of plasma; and (b) selectively depositing cobalt metal on or within the layer of copper or copper alloy, while not depositing cobalt on the layer of dielectric by contacting the treated substrate with an organometallic cobalt compound comprising a substituted or unsubstituted allyl ligand, and with a reducing agent, in an absence of plasma.

In another aspect, a non-transitory computer machine-readable medium comprising program instructions is provided for control of a cobalt deposition apparatus, wherein the program instructions include code for performing the methods provided herein.

DETAILED DESCRIPTION OF A PREFERRED EMBODIMENT

Figure 1A:
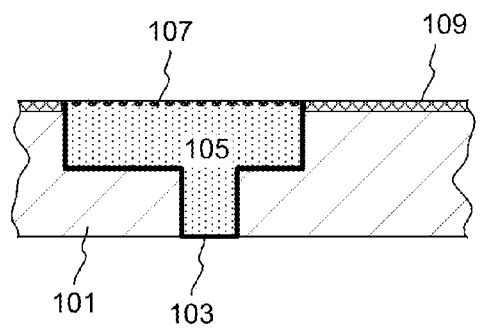
FIGS. 1A-1D show schematic cross sectional depictions of device structures created during a selective cobalt deposition process according to some embodiments.

Electromigration is becoming a significant reliability problem in IC fabrication, as the dimensions of devices continue to decrease, and current densities experienced by interconnects are increasing. Electromigration manifests itself in migration of copper atoms with the current, and in formation of voids within the interconnect. Formation of voids can subsequently lead to device failure. Migration of copper atoms is particularly pronounced at copper/diffusion barrier interfaces and along grain boundaries. At 90 nm and 45 nm technology nodes and beyond, methods for improving electromigration performance are needed. While electromigration performance can be improved by introducing dopant elements into interconnect, such dopants typically have higher resistivity than copper and can significantly increase interconnect resistance. Thus, uncontrolled doping of copper in the interconnects can lead to interconnects with unacceptably high resistance.

Another approach to addressing the electromigration problem involves forming caps on the copper lines, where the capping material has good adhesion to both the underlying copper and to a dielectric diffusion layer above it, and where the capping material is capable of reducing electromigration of copper in the interconnects. Ruthenium caps and CoWP have been used, but selective deposition of these materials on copper versus surrounding dielectric, can be difficult to achieve.

A method for controlled and selective formation of cobalt layers on copper surfaces in the presence of exposed dielectric is disclosed herein. The cobalt layers reduce electromigration, and provide improved adhesion between copper and overlying dielectric diffusion barrier layers. In some embodiments, provided methods further achieve selective deposition of cobalt onto copper in the presence of exposed tantalum and tantalum compounds (e.g., tantalum nitride or tantalum oxide). In some embodiments, the cobalt capping methods are preferably performed without using plasma. Plasma-free processing is a significant advantage of provided methods, because plasma can be damaging to exposed dielectric, particularly to mechanically delicate, porous dielectrics.

Methods provided herein can be used on the substrates comprising exposed copper and copper alloys, such as CuAl and CuMn. For clarity, the methods will be subsequently illustrated making reference to deposition on copper. It is understood that depositions on copper alloys can be similarly conducted.

Cobalt can be deposited both as cobalt compounds and in its metallic form. It was demonstrated that metallic cobalt with no significant carbon contamination can be deposited by the methods provided herein.

The selectivity of cobalt deposition on copper is achieved in the presence of a variety of dielectric materials. Examples of dielectric materials include silicon oxide based dielectrics, such as carbon-doped silicon oxide materials, organic dielectrics, porous dielectrics, etc. The methods are particularly advantageous for depositing cobalt in the presence of ULK dielectrics, having a dielectric constant of less than about 2.8, because the methods are mild and are not damaging even to most mechanically weak ULK dielectrics. Examples of suitable dielectrics include polymeric CVD-deposited films having Si—O—Si network with $CH_3$ terminations, such as Aurora®, and other CVD-deposited low-k dielectrics such as Black Diamond. Dielectrics deposited by spin-on methods can also be used.

In some embodiments, a method for forming a semiconductor device structure includes: providing a semiconductor substrate having a surface with an exposed layer of copper or copper alloy and an exposed layer of dielectric; treating the substrate surface with a process gas which includes $H_2$, while irradiating the substrate with ultraviolet (UV) radiation in an absence of plasma; and selectively depositing cobalt on or within the layer of copper or copper alloy, while not depositing cobalt on the layer of dielectric by contacting the treated substrate with an organometallic cobalt compound comprising a substituted or unsubstituted allyl ligand, and with a reducing agent in an absence of plasma.

The pre-treatment of the substrate surface and the choice of an organometallic cobalt compound are important factors in selectivity control. Further, in the preferred embodiments cobalt is deposited by provided methods in its metallic form without significant contamination with carbon and organic residues. Due to lack of substantial contamination, no additional plasma treatments are necessary for the deposited cobalt layer.

It is noted that both deposition selectivity, and purity of deposited cobalt are largely dependent on the chemical structure of the organometallic cobalt precursor used in the deposition.

Presence of an allyl ligand in the organometallic cobalt compound was found to lead to highly selective deposition of cobalt in its metallic form. In some embodiments, the organometallic compound having a substituted or unsubstituted allyl ligand is preferred. In some embodiments, the allyl ligand is unsubstituted.

In some embodiments the organometallic cobalt compound has the following structure:

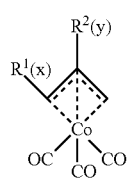

I where $R^1$ is $C_1$-$C_8$-alkyl, $R^2$ is $C_1$-$C_8$ alkyl, x is zero, 1 or 2; and y is zero or 1.

In some embodiments $R^1$ is a $C_2$-$C_8$-alkyl, $R^2$ is independently $C_2$-$C_8$ alkyl.

The term "alkyl" as used herein refers to saturated hydrocarbon chain of 1 to 8 atoms in length, such as methyl, ethyl, propyl, butyl, pentyl, hexyl, heptyl, and octyl. The term "alkyl" includes both straight and branched hydrocarbon chains. Thus, the term propyl includes both n-propyl and isopropyl. The term butyl includes both n-butyl, sec-butyl, iso-butyl, and tert-butyl.

In some embodiments x is 0 and y is 1. An example of an organometallic compound in accordance with this embodiment is shown below:

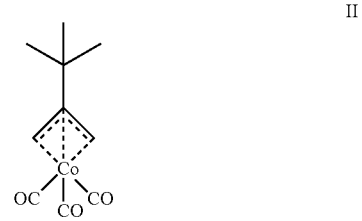

II

The described compounds are available from SAFC-Hitech of Haverhill, Mass., in conjunction with corresponding deposition apparati available from Lam Research Inc., of Fremont, Calif. Further, compounds suitable for use in the embodiments provided herein and methods of their synthesis are described in US Patent Publication No. 2012/0177845 published Jul. 12, 2012, which is incorporated herein by reference in its entirety for the purposes of providing description of suitable chemical compositions.

FIGS. 1A-1D illustrate partially fabricated IC structures in the course of cobalt deposition process in accordance with an embodiment provided herein. The process starts with a structure illustrated in FIG. 1A (a Damascene structure), which contains a layer of dielectric 101 (e.g., a ULK dielectric) having an embedded copper line 105, wherein the copper line 105 is separated from the dielectric by a thin layer of diffusion barrier 103 (e.g., Ta, TaN, or a Ta/TaN bilayer). The surface of the structure contains a layer of copper, which is typically contaminated with copper oxide 107, a layer of dielectric, which typically contains a damaged dielectric portion 109, and a diffusion barrier layer 103 in the proximity of copper layer. When the diffusion barrier layer 103 is made of Ta/TaN bilayer, the surface of such tantalum bilayer typically contains tantalum oxide and tantalum nitride. The substrate provided in FIG. 1A is obtained after excess of copper and of diffusion barrier layer material were removed from the field region of the substrate by a chemical mechanical polishing (CMP) process. Because CMP is a wet process that involves polishing the substrate surface with an aqueous slurry containing abrasive particles and chemical polishing compounds, the exposed damaged portion of the dielectric 109 typically contains absorbed water and is not very hydrophobic.

Figure 1B:
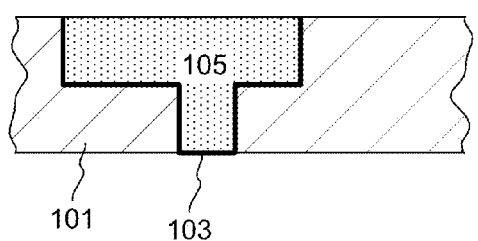
Figure 1C:
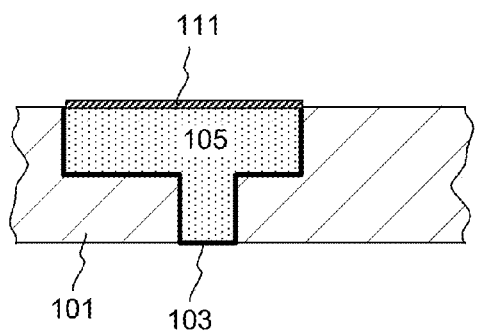
Figure 1D:
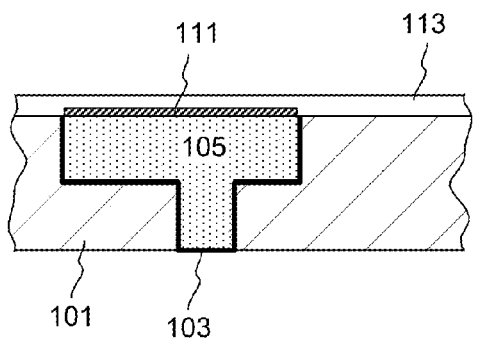

In the next step, the substrate is treated to reduce copper oxide to copper, to increase hydrophobicity of the dielectric layer, and to increase the number of surface methyl groups in organics-containing dielectrics. The treatment involves contacting the substrate with a process gas comprising $H_2$ while irradiating the substrate with UV light. The resulting structure is shown in FIG. 1B, which illustrates that copper oxide 107 on the surface of copper is reduced to copper 105 and the damaged layer of dielectric 109 is substantially repaired. Importantly, the treatment is performed, preferably, in an absence of plasma so as to avoid plasma damage to dielectric.

After hydrophobicity of the dielectric is restored, and copper oxide is reduced to copper, selective cobalt deposition can be conducted. The substrate is contacted with a reducing agent and with an organometallic cobalt compound containing a substituted or unsubstituted allyl ligand to selectively deposit between about 1-300 Å of cobalt, such as between about 10-300 Å onto the copper line, as illustrated by the structure 1C, showing cobalt layer 111 residing over the copper line 105, but not over the dielectric 101 or over the diffusion barrier 103.

In other embodiments, the deposited cobalt is deposited within the top portion of copper line, and does not provide any additional thickness over the copper layer. In some embodiments, the cobalt is deposited both on and within copper layer. The term "deposited on or within copper layer" as used herein generally includes deposition on copper, deposition within copper and deposition occurring both on and within the copper layer.

The deposited cobalt is preferably a metallic cobalt which is not substantially contaminated with carbon-containing residues, and, therefore, does not require any plasma treatment, which otherwise would be needed to remove the contaminants. Next, a dielectric diffusion barrier or an etch stop layer, such as doped or undoped silicon nitride and/or doped or undoped silicon carbide is deposited over the entire surface of the substrate. The resulting structure 1D illustrates a silicon nitride diffusion barrier layer 113 residing on top of the dielectric layer 101 and on top of the cobalt layer 111.

Figure 2:
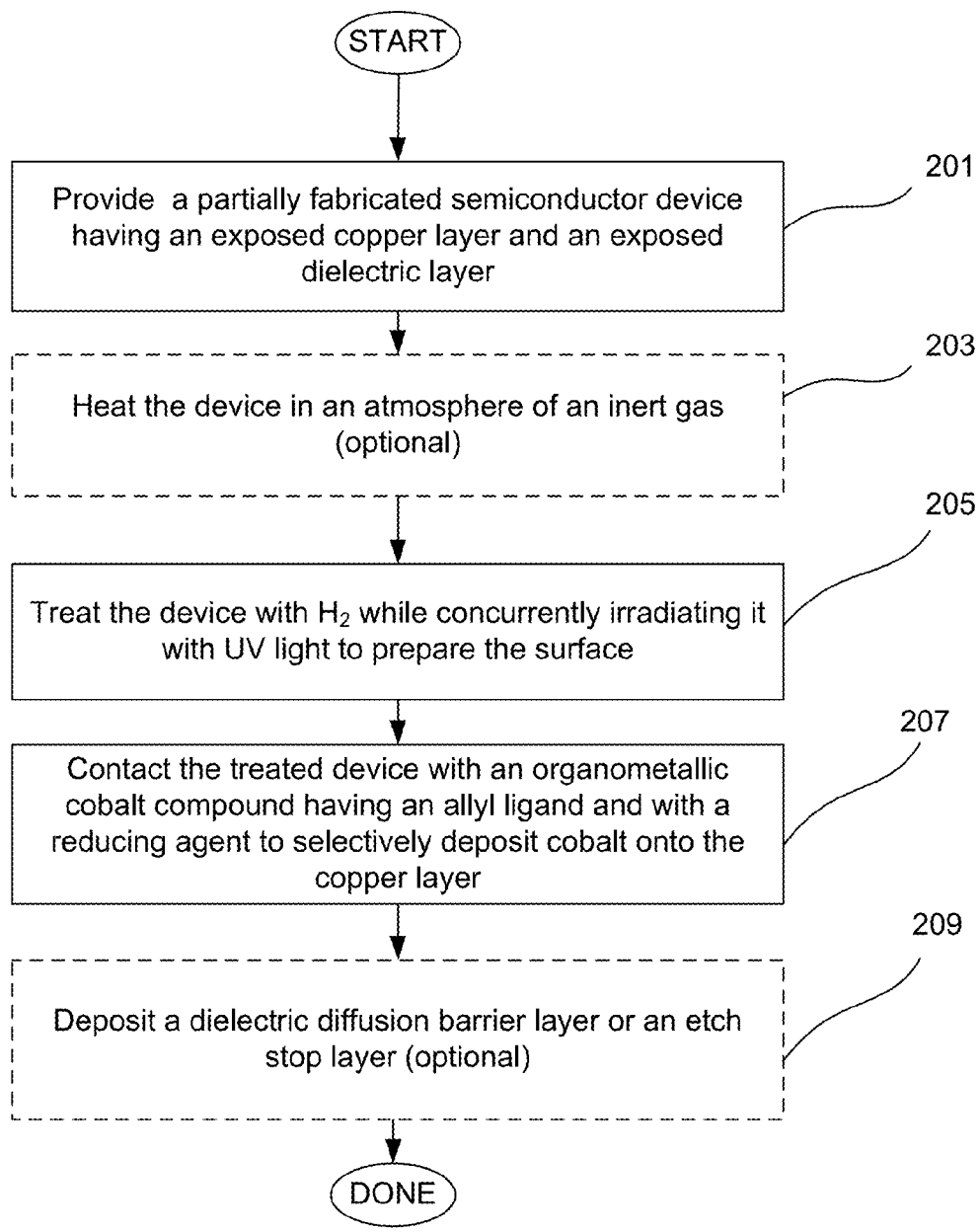
FIG. 2 presents a process flow diagram of a cap-forming process according to some embodiments presented herein.

FIG. 2 provides an example of a process flow diagram for the method of selectively depositing cobalt layer. In operation 201 a partially fabricated integrated circuit device having an exposed copper layer and an exposed dielectric layer is provided. Next, in the operation 203 the substrate is optionally heated in an atmosphere of inert gas, such as helium. For example, it can be heated at a temperature of between about 30-250° C. for about 1-600 seconds. After the substrate has been uniformly heated, it is treated in operation 205 with $H_2$ (or with a process gas including $H_2$ and an inert gas such as He), while concurrently being irradiated with UV light. Typically the substrate is concurrently contacted with $H_2$ and He and is irradiated for about 1-300 seconds. In some embodiments the provided UV light has a wavelength of between about 190-450 nm. The treatment is preferably performed at a temperature of between about 300-400° C., such as at about 350° C., and at a pressure of between about 0.2-50 Torr. The treatment in this embodiment is performed in an absence of plasma.

Next, in operation 207 the pre-treated substrate is contacted with the organometallic cobalt compound having a substituted or unsubstituted allyl group, such as any of the compounds described above, in the presence of a reducing agent, such as $H_2$, to selectively deposit cobalt onto the copper layer. $H_2$, which is typically provided in a mixture with an inert gas, such as argon, is a preferred reducing agent in many embodiments. Other suitable reducing agents include hydrazine, hydrazine hydrate, alkyl hydrazines, 1,1-dialkylhydrazines, 1,2-dialkylhydrazines, ammonia, silanes, disilanes, trisilanes, germanes, diborane, formaldehyde, amine boranes, dialkyl zinc, alkyl aluminum compounds, alkyl gallium compounds, alkyl indium compounds and their combinations. While in a preferred embodiment cobalt deposition is performed in an absence of plasma, in alternative embodiments hydrogen plasma and/or ammonia plasma may be used.

The organometallic cobalt compound is typically provided in a vaporized form in a mixture with an inert gas such as argon. It was found that relatively low temperatures should preferably be used to suppress gas-phase reaction between the organometallic compound and the reducing agent that may lead to reduced deposition selectivity. For example, process temperatures of between about 60-200° C., such as between 70-100° C. can be used to effectively promote deposition of cobalt at the surface of copper, while being sufficiently low for a gase-phase reaction to be suppressed. Further, it was found that relatively low pressures are also advantageous for suppressing the gas-phase reaction between the cobalt compound and the reducing agent, while allowing surface-driven deposition onto copper. In some embodiments, the cobalt deposition is performed at a pressure of between about 0.2-200 Torr. For example, in some embodiments, deposition is performed at a pressure of about 1 torr. Further, it was found that a relatively small gap between the substrate and the showerhead delivering the reagents is advantageous for the improved uniformity of deposition. In some embodiments the gap between the showerhead and the substrate pedestal is between about 4-14 mm.

In alternative embodiments, cobalt is deposited by an ALD-type method. In an ALD mode, the organocobalt compound and the reducing agent are sequentially delivered to the substrate. For example, an organometallic compound may be delivered and adsorbed on the substrate's surface followed by purging or evacuation of the process chamber to remove the organocobalt compound. Next, the reducing agent is introduced and is allowed to react with the organocobalt compound on the surface of the substrate, followed by a purge or evacuation. The dosing of reagents can be repeated as many times as necessary for building a cobalt layer of required thickness.

After the cobalt layer is deposited, the IC substrate can be further processed, as needed. For example, in an operation 209 a dielectric diffusion barrier or an etch stop layer is deposited onto the substrate. For example doped or undoped SiN or SiC layers can be deposited over cobalt and dielectric, e.g., by PECVD. After the diffusion barrier is deposited, next layer of ILD dielectric is typically formed over the dielectric diffusion barrier layer, e.g., by PECVD or a spin-on method.

Apparatus

The selective cobalt deposition methods provided herein can be implemented in any type of apparatus that allows for pre-treatment of the wafer substrate with UV light and for deposition of cobalt from an organometallic compound in a CVD or ALD process chamber. In some embodiments, the surface pre-treatment and cobalt deposition are performed in one chamber equipped with a pedestal configured for supporting the substrate, a UV lamp configured for irradiating the substrate, and one or more inlets configured for introduction of the reagents. In other embodiments, pre-treatment of the surface and deposition of cobalt are performed in different chambers or in different stations of one chamber. Preferably the substrate is transferred from the pre-treatment chamber (or station) to the cobalt deposition chamber (or station) without exposing the substrate to ambient atmosphere and/or without a vacuum break. This is significant, because the pre-treated surface of copper can become re-oxidized if it contacts atmospheric oxygen or moisture. Thus, in some embodiments the apparatus is configured to have at least two chambers or stations, where one chamber (or station) is configured for substrate pre-treatment, and another chamber (or station) is configured for cobalt deposition, and wherein the apparatus further includes a transfer mechanism configured for transferring the substrate from the first chamber to the second chamber without a vacuum break. An example of a module suitable for supporting the pre-treatment chamber and the cobalt deposition chamber is Vector™ module available from Lam Research, Inc., of Fremont, Calif.

In some embodiments, the chamber for surface pre-treatment has a substrate support configured for holding the substrate, a UV lamp configured for irradiating the substrate and the inlet for introducing the process gas that includes hydrogen, the inlet being in fluid communication with the source of hydrogen gas. The chamber is further connected with a controller, which includes program instructions or built-in logic for performing the pre-treatment operations. For example the controller may specify appropriate temperature, pressure, and timing for the pre-treatment process described herein. An example of a chamber that is suitable for pre-treatment is provided, for example in commonly owned Patent Application Pub. No. 2011/0111533 published on May 12, 2011, titled "UV and Reducing Treatment for K Recovery and surface Clean in Semiconductor Processing" by B. Varadarajan et al., which is herein incorporated by reference in its entirety for the purpose of providing details of an apparatus.

Figure 3:
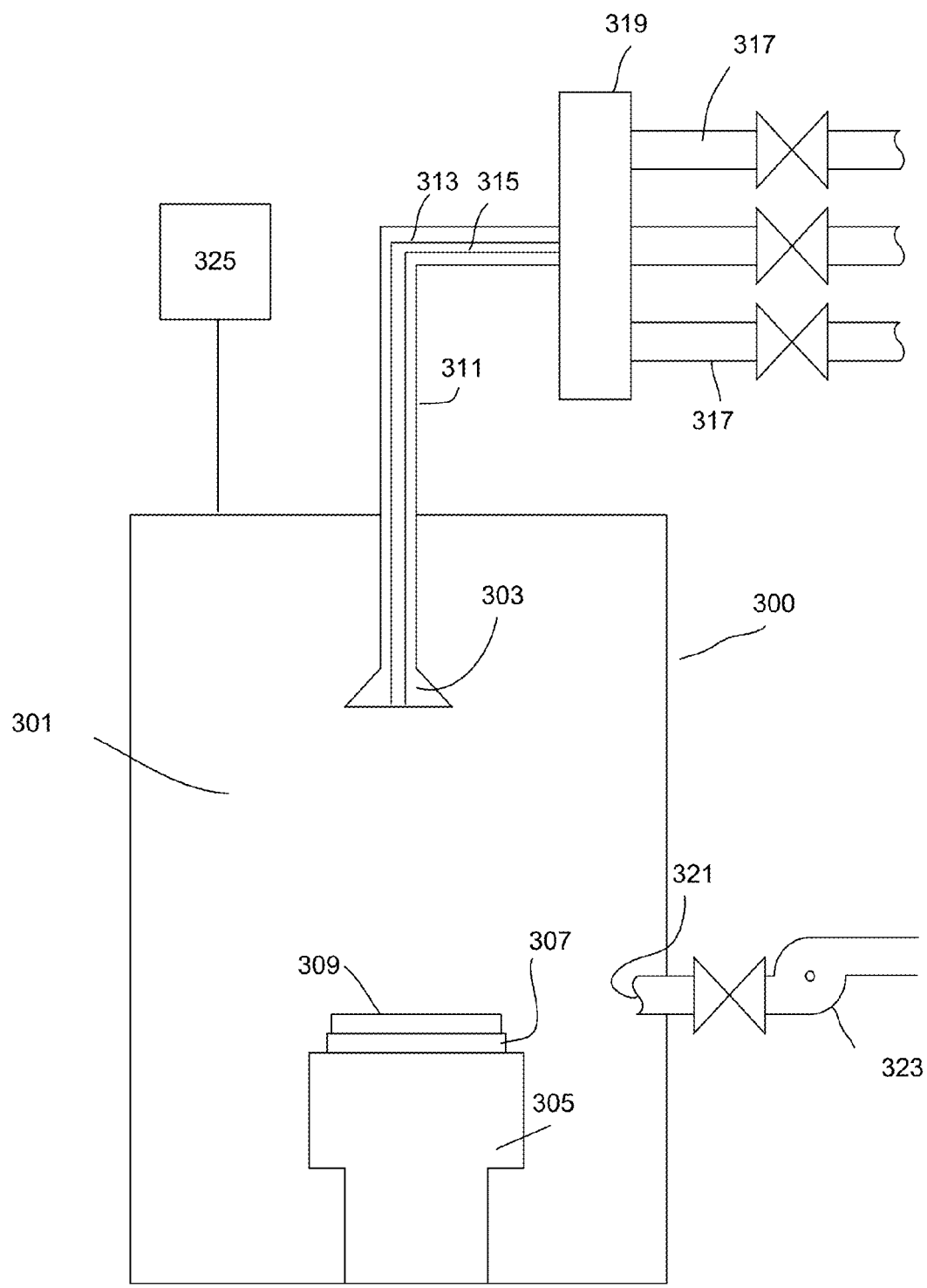
FIG. 3 presents a schematic view of a process chamber suitable for selective deposition of cobalt according to some embodiments provided herein.

The chamber configured for cobalt deposition can be any type of a vapor deposition chamber. FIG. 3 provides a simple exemplary block diagram depicting various chamber components arranged for implementing cobalt deposition. As shown, a reactor 300 includes a process chamber 301, which encloses other components of the reactor including a showerhead 303 working in conjunction with a heater block 305.

Within the reactor, a wafer pedestal 307 supports a substrate 309. The pedestal typically includes a chuck, a fork, or lift pins to hold and transfer the substrate during and between the deposition reactions. The chuck may be an electrostatic chuck, a mechanical chuck or various other types of chuck as are available for use in the industry and/or research.

The process gases are introduced via inlet 311, which in the depicted embodiment comprises a dual-plenum showerhead, in fluid communication with the sources of reducing agent and of organocobalt compound. In the depicted embodiment, the reducing agent (e.g., $H_2$) and the organometallic cobalt compound are delivered through separate lines 313 and 315 and do not mix until they are released into the chamber. Such configuration allows for suppression of gase-phase reaction within the showerhead. Multiple source gas lines 317 are connected to manifold 319. Some of the gases may be premixed. For example argon may be premixed with the organometallic cobalt compound, and the reducing agent can be pre-mixed with argon or another inert gas if desired. Appropriate valving and mass flow control mechanisms are employed to ensure that the correct gases are delivered during the deposition process. In embodiments employing chemical precursor(s) delivered in the liquid form, liquid flow control mechanisms are employed. The liquid is vaporized and mixed with other process gases during its transportation in a manifold heated above its vaporization point before reaching the deposition chamber.

Process gases exit chamber 300 via an outlet 321. A vacuum pump 323 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

A controller 325 is connected with the apparatus and is configured to control the deposition process. The controller may include program instructions or logic for the methods described herein. For example the controller may control pressure temperature, gas composition, and other process parameters as required.

Figure 4:
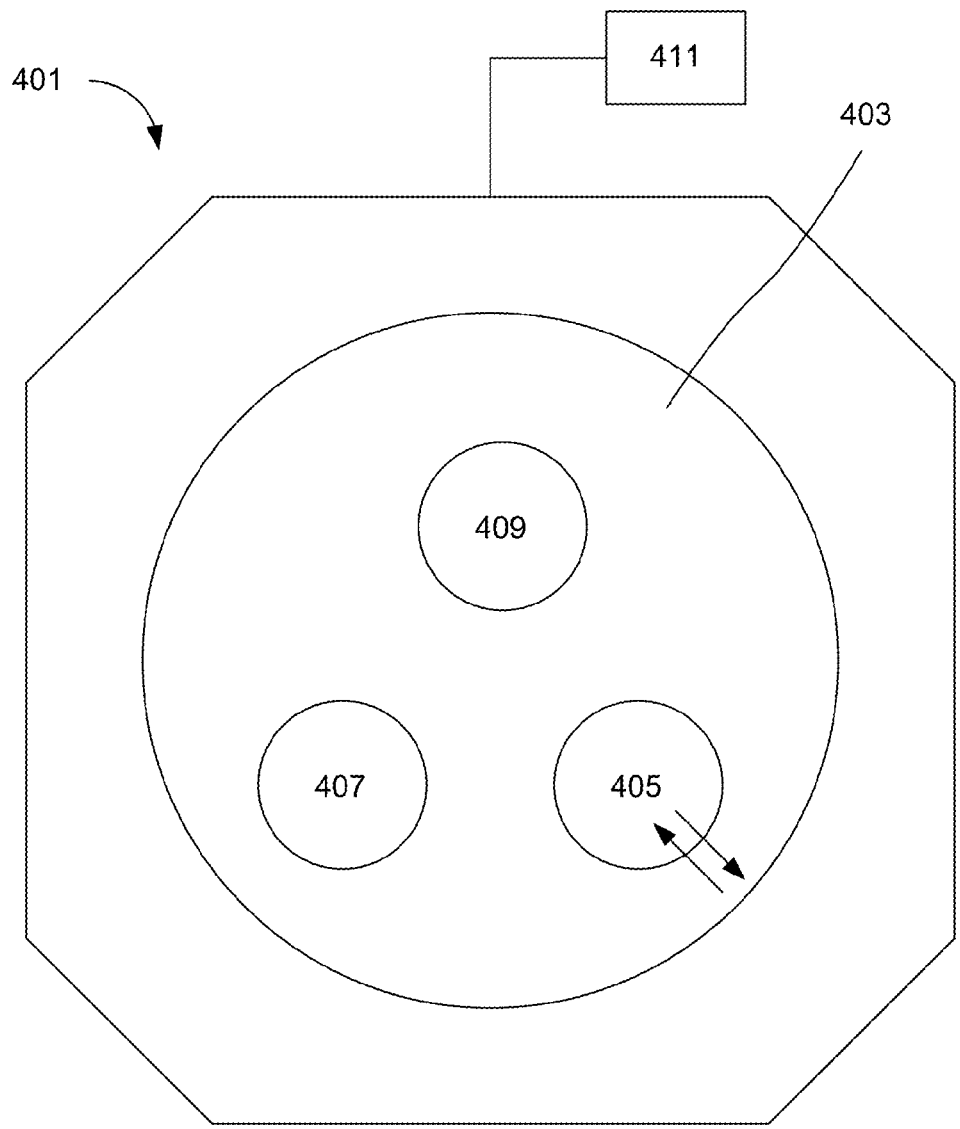
FIG. 4 provides a schematic presentation of a module suitable for selective deposition of cobalt.

FIG. 4 provides a simplified block diagram of a module configured for cobalt deposition and for deposition of a dielectric diffusion barrier or an etch stop layer. The module 401 includes a chamber 403, which allows to maintain vacuum within the module, and allow transfer of substrates between individual apparatuses within the module without a vacuum break. The module contains a loadlock configured for admitting the wafer substrates, a first apparatus 405, configured for pre-treating the surface of the substrate with $H_2$ concurrently with UV irradiation, a second apparatus 407, configured for cobalt deposition, and a third apparatus 409 configured for deposition of a dielectric diffusion barrier layer, such as SiN and SiC. The apparatus 409 is typically a plasma enhanced chemical vapor deposition (PECVD) reactor while apparatuses 405 and 407 may be as described above. The module further includes a transfer mechanism configured for admitting the wafer substrate from the entry loadlock and for transferring the substrate from the pre-treatment apparatus 405 to the cobalt deposition apparatus 407 and, next, to the dielectric diffusion barrier apparatus, 409, without a vacuum break. The wafer substrate can then be removed from the module via an exit loadlock. A controller 411 is connected with the apparatus and includes program instructions or logic for performing any of the methods described herein. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In some embodiments a system is provided, wherein the system includes an apparatus as described herein and a stepper.

EXPERIMENTAL EXAMPLES

It was experimentally confirmed that the choice of the organometallic cobalt compound is of high importance for the success of selective cobalt deposition. Unexpectedly, organometallic cobalt compound, having an allyl ligand, was shown to provide cobalt films that do not require additional plasma treatment to remove carbon contaminants.

Example 1

Comparative

A thin cobalt film was deposited on a substrate containing PVD-deposited copper and a ULK dielectric (having k of about 2.4) using compound III as the organometallic cobalt compound.

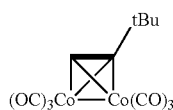

III

Figure 5A:
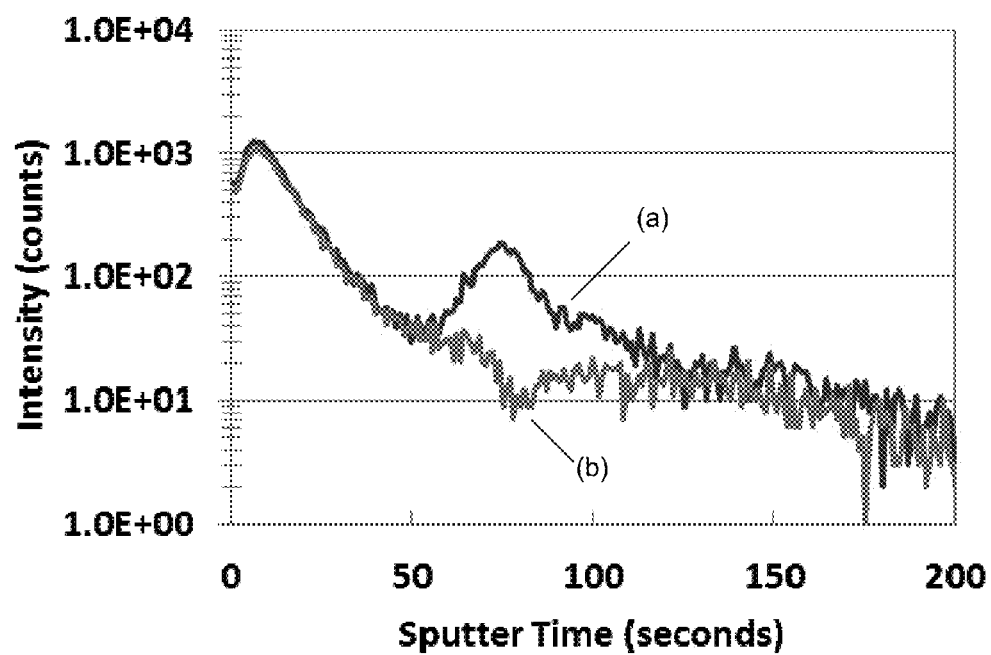
FIG. 5A is an experimental plot showing results of time-of-flight secondary ion mass spectrometry (TOF-SIMS) analysis of carbon content in the cobalt-capped substrate before and after plasma treatment, where cobalt was deposited using an organometallic cobalt compound III (comparative example).

Compound III belongs to a different class of organometallic compounds than allyl-containing compounds provided herein. The deposition was performed after pre-treatment with $H_2$ and UV irradiation. Silicon nitride (100 Å) layer was deposited on the substrate by PECVD after cobalt deposition Carbon content in the resulting structure was determined using TOF SIMS analysis. The results are shown in FIG. 5A, where curve (a) illustrates carbon content in the structure, where cobalt was not treated with plasma post-deposition, and curve (b) illustrates carbon content in the structure that was treated with plasma in the presence of $NH_3$ after cobalt deposition. It can be seen that the carbon content is substantially reduced after plasma treatment, indicating that the initially deposited cobalt contained carbon residue that was eliminated by plasma treatment.

Example 2

A thin cobalt film was deposited on a substrate containing PVD-deposited copper and a ULK dielectric (having k of about 2.4) using compound II as the organometallic cobalt compound, which is an organometallic cobalt compound containing a substituted allyl ligand.

Figure 5B:
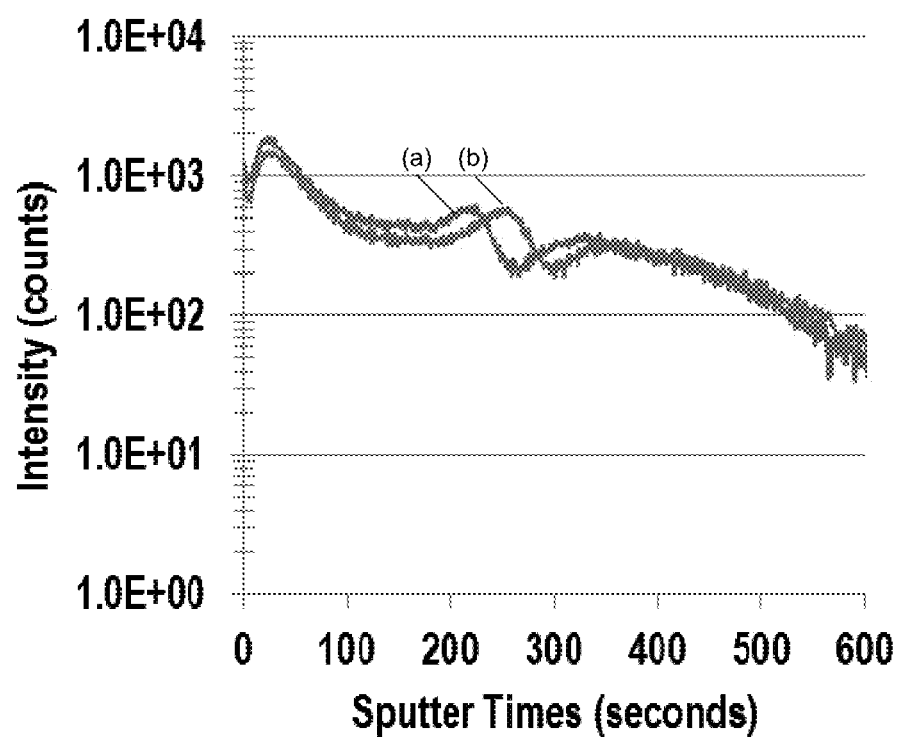
FIG. 5B is an experimental plot showing results of a TOF-SIMS analysis of carbon content in the cobalt-capped substrate before and after plasma treatment, where cobalt was deposited using compound II in accordance with an embodiment provided herein.

The deposition was performed after pre-treatment with $H_2$ and UV irradiation. Silicon nitride (100 Å) layer was deposited on the substrate by PECVD after cobalt deposition Carbon content in the resulting structure was determined using TOF SIMS analysis. The results are shown in FIG. 5B, where curve (a) illustrates carbon content in the structure, where cobalt was not treated with plasma post-deposition, and curve (b) illustrates carbon content in the structure that was treated with plasma in the presence of $NH_3$ after cobalt deposition. It can be seen that carbon content does not substantially change after plasma treatment, indicating that the initially deposited cobalt did not contain substantial amounts of organic residues in the film. These results indicate that plasma post-treatment is not necessary for cobalt films deposited using methods provided herein.

Example 3

Figure 6A:
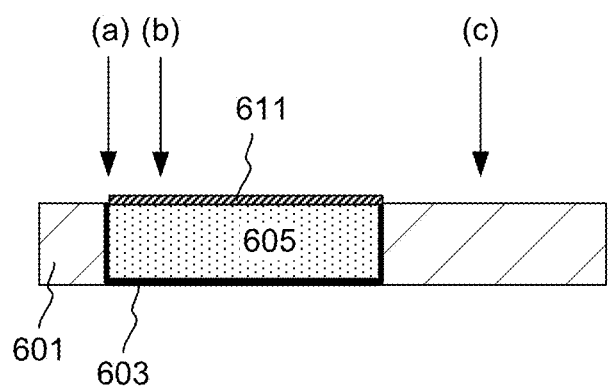
FIG. 6A is a schematic cross-sectional presentation of a cobalt-capped substrate illustrating sections subjected to electron energy loss spectroscopy (EELS) scan.
Figure 6B:
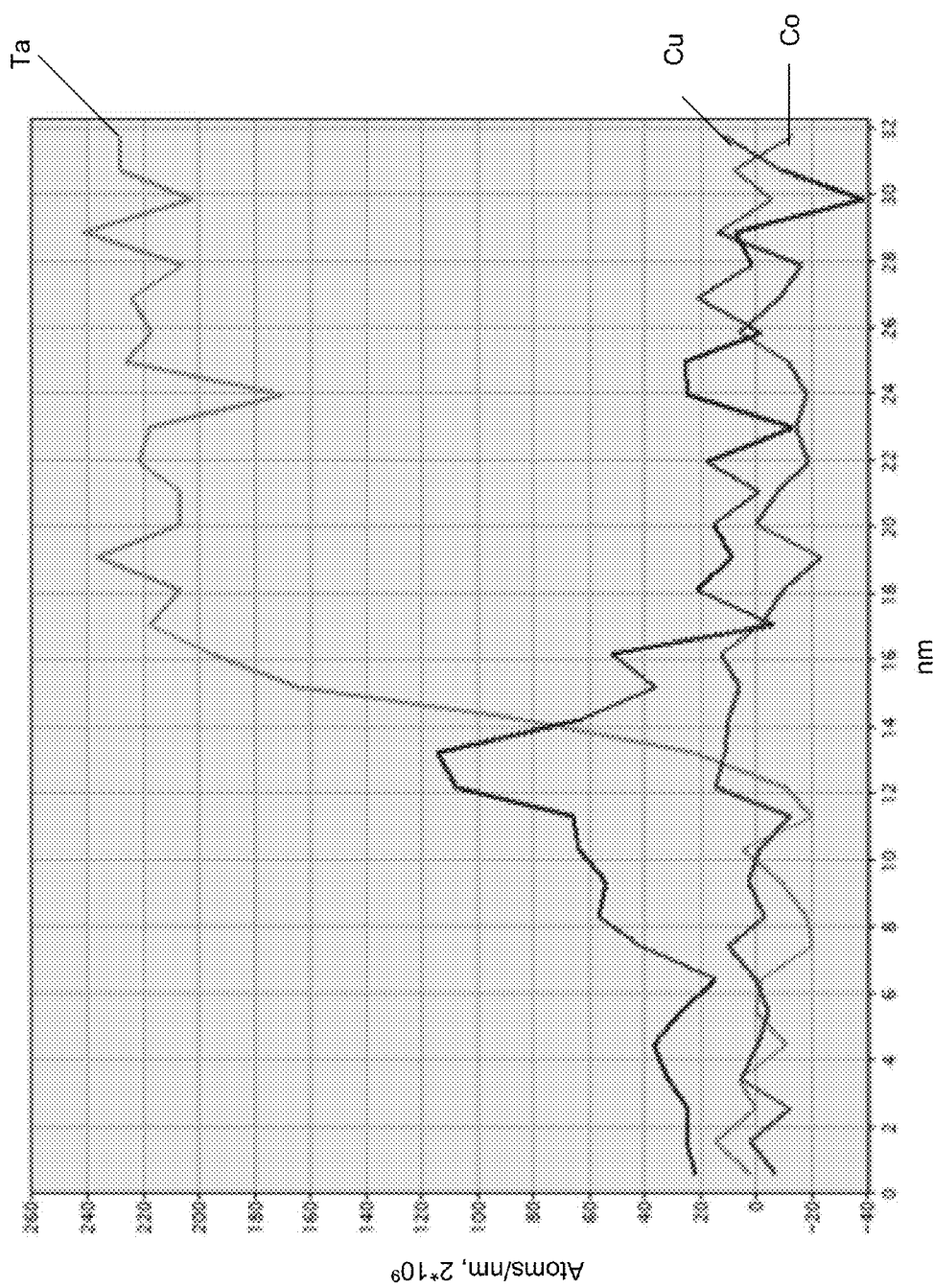
FIG. 6B is an experimental plot of Ta, Co, and Cu content determined by EELS scan at section (a) shown in FIG. 6A.
Figure 6C:
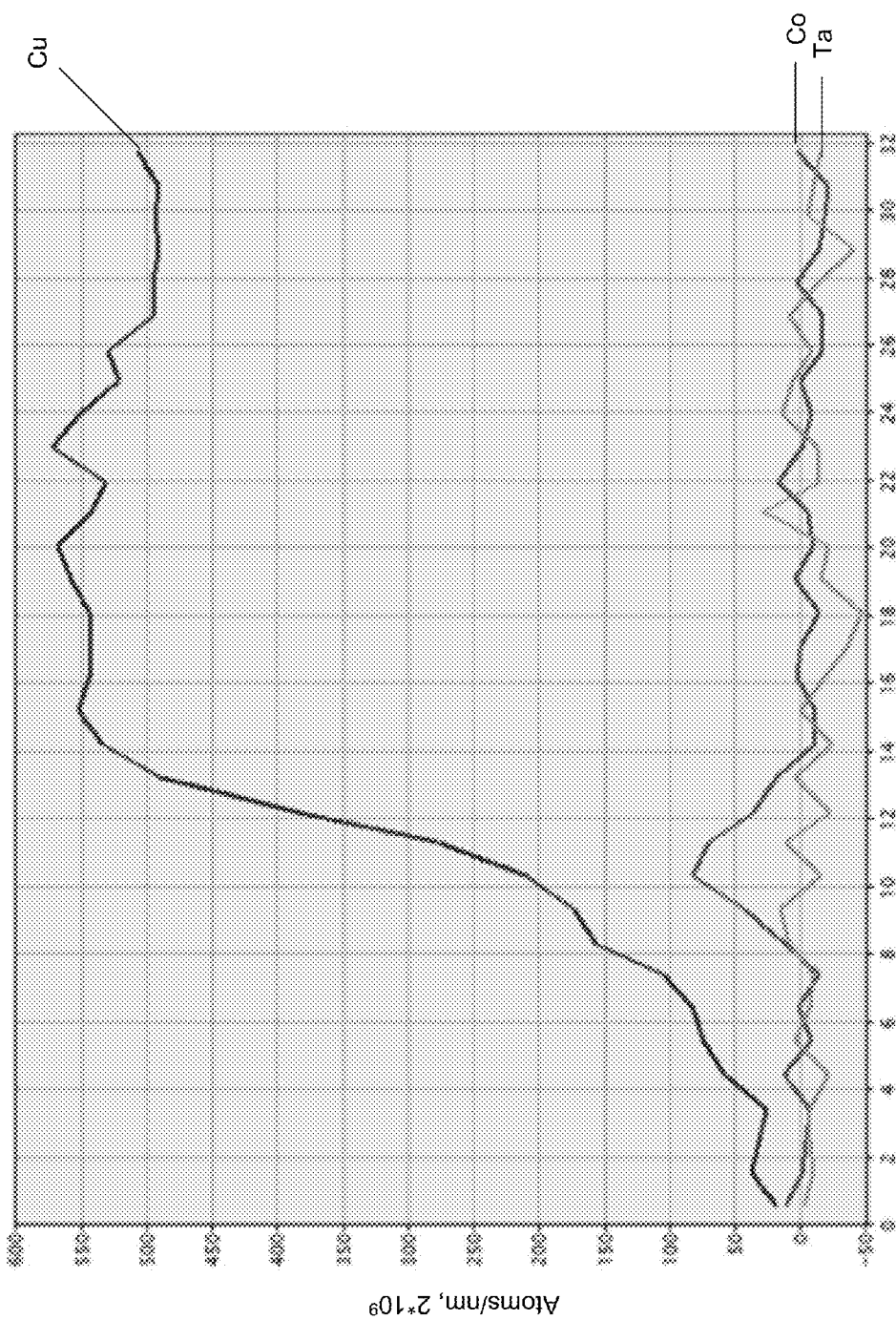
FIG. 6C is an experimental plot of Ta, Co, and Cu content determined by EELS scan at section (b) shown in FIG. 6A.
Figure 6D:
FIG. 6D is an experimental plot of Co, Si, C, and O content determined by EELS scan at section (c) shown in FIG. 6A.

A cobalt film was deposited on the substrate containing exposed copper, ULK dielectric, and tantalum diffusion barrier, using compound II and $H_2$ for cobalt deposition. The deposition was performed after pre-treatment with $H_2$ and UV irradiation. The resulting structure was then analyzed by EELS. The locations of scans are illustrated in FIG. 6A, which illustrates ULK dielectric 601, and a copper line 605, where copper line is lined with tantalum diffusion barrier 103 and is capped with cobalt 607. The first scan (a) was made through diffusion barrier 603. The second scan (b) was made through cobalt cap 607 and copper line 605, and the third scan (c) was made through the dielectric 601. The results of the scans are illustrated in FIG. 6B (for the scan through section (a)), FIG. 6C (for the scan through section (b)) and in FIG. 6C (for the scan through section (c)). FIG. 6B illustrates that the tantalum diffusion barrier does not contain substantial amounts of cobalt. FIG. 6C illustrates, that, as expected, the cobalt cap was formed on the copper line. FIG. 6D illustrates that that no deposition of cobalt on the dielectric is observed.

Example 4

Deposition of cobalt caps using compound II and, in a separate experiment, using compound III was conducted under similar conditions (UV/$H_2$ pre-treatment and CVD cobalt deposition in the presence of $H_2$ as the reducing agent). When compound III was used, growth of cobalt islands was observed on the dielectric. Further cobalt also would grow on the Ta diffusion barrier layer. In contrast, when compound II was used, high selectivity of deposition on copper was observed both with respect to dielectric and tantalum.

The selectivity was measured by XRF as a ratio of XRF counts on cobalt in the test structure minus XRF counts on copper in a control structure to XRF counts on dielectric in the test structure minus XRF counts on dielectric in a control structure. When compound II was used as the organometallic cobalt compound, copper/dielectric XRF selectivities of about 400× were achieved. When compound III was used as the organometallic cobalt compound copper/dielectric XRF selectivities did not exceed 100×.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method for forming a semiconductor device structure, the method comprising:
   (a) providing a semiconductor substrate having a surface comprising
      (i) an exposed layer of copper or copper alloy and
      (ii) an exposed layer of dielectric;
   (b) treating the substrate surface with a process gas comprising $H_2$, while irradiating the substrate with ultraviolet (UV) radiation in an absence of plasma; and
   (c) selectively depositing cobalt metal on the layer of copper or copper alloy, while not depositing cobalt on the layer of dielectric by contacting the treated substrate with an organometallic cobalt compound comprising a substituted allyl ligand, and with a reducing agent in an absence of plasma, wherein the organometallic cobalt compound comprising a substituted allyl ligand is:

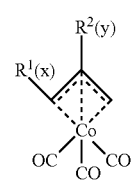

I where $R^1$ is $C_1$-$C_8$-alkyl, $R^2$ is $C_1$-$C_8$ alkyl, x is zero, 1 or 2; and y is 1.

2. The method of claim 1, wherein the organometallic cobalt compound is:

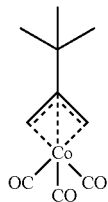

3. The method of claim 1, further comprising depositing a dielectric diffusion barrier layer or an etch stop layer, onto the substrate after (c).

4. The method of claim 1, wherein the deposited cobalt is not treated with plasma prior to deposition of a dielectric diffusion barrier layer or an etch stop layer.

5. The method of claim 1, wherein the substrate surface further comprises:
(iii) a layer of tantalum or tantalum compound,
wherein in (c) the cobalt metal is selectively deposited on the copper or copper alloy and is not substantially deposited on the layer of tantalum or tantalum compound.

6. The method of claim 1, wherein (b) is performed in a first station of a module, and (c) is performed in a second station of a module, and wherein the semiconductor device structure is transferred from the first station to the second station without a vacuum break.

7. The method of claim 1, wherein (b) is performed at a temperature of between about 300-400° C.

8. The method of claim 1, wherein (b) is performed at a temperature of about 350° C.

9. The method of claim 1, wherein (b) comprises irradiating the substrate with the light having a wavelength of between about 190-450 nm.

10. The method of claim 1, wherein (b) reduces copper oxide to copper on the layer of copper or copper alloy and provides hydrophobicity to the dielectric layer.

11. The method of claim 1, wherein in (c) the reducing agent comprises $H_2$.

12. The method of claim 1, wherein (c) comprises selectively depositing cobalt metal at a temperature of between about 60-200° C.

13. The method of claim 1, wherein (c) comprises selectively depositing cobalt metal at a temperature of between about 70-100° C.

14. The method of claim 1, wherein (c) comprises selectively depositing cobalt metal at a pressure of between about 0.2-200 Torr.

15. The method of claim 1, wherein (c) comprises selectively depositing cobalt metal at a pressure about 1 Torr.

16. The method of claim 1, wherein (c) comprises selectively depositing cobalt metal at a pressure of between about 0.2-200 Torr, at a temperature of between about 60-200 degrees C. and using compound II as the organometallic cobalt compound.

17. The method of claim 1, wherein the exposed dielectric is an ultra low-k (ULK) dielectric having a dielectric constant of less than about 2.8.

18. The method of claim 1, wherein (c) deposits between about 1-300 Å of cobalt metal onto the layer of copper or copper alloy.

* * * * *